(12) United States Patent
Shin et al.

(10) Patent No.: US 12,369,320 B2
(45) Date of Patent: Jul. 22, 2025

(54) VERTICAL SEMICONDUCTOR DEVICE AND METHOD FOR FABRICATING THE SAME

(71) Applicant: SK hynix Inc., Gyeonggi-do (KR)

(72) Inventors: Wan Sup Shin, Gyeonggi-do (KR); Jong Gi Kim, Gyeonggi-do (KR); Seung Wook Ryu, Gyeonggi-do (KR); Jun Seok Oh, Gyeonggi-do (KR); Heung Ju Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 451 days.

(21) Appl. No.: 17/671,888

(22) Filed: Feb. 15, 2022

(65) Prior Publication Data
US 2023/0040214 A1 Feb. 9, 2023

(30) Foreign Application Priority Data
Aug. 9, 2021 (KR) .................. 10-2021-0104829

(51) Int. Cl.
| | |
|---|---|
| H10B 43/27 | (2023.01) |
| H10B 41/10 | (2023.01) |
| H10B 41/27 | (2023.01) |
| H10B 43/10 | (2023.01) |

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
None
See application file for complete search history.

(56) References Cited

U.S. PATENT DOCUMENTS

| | | | |
|---|---|---|---|
| 10,720,445 B1 | 7/2020 | Shimizu et al. | |
| 10,797,061 B2 | 10/2020 | Nishida et al. | |
| 10,811,428 B2 | 10/2020 | Choi | |
| 10,854,627 B1 | 12/2020 | Moriyama et al. | |
| 2017/0162594 A1* | 6/2017 | Ahn | H10B 41/27 |
| 2019/0355742 A1 | 11/2019 | Maruyama et al. | |
| 2020/0328226 A1* | 10/2020 | Park | H01L 23/535 |
| 2021/0167083 A1* | 6/2021 | Kim | H01L 23/53295 |
| 2021/0257386 A1* | 8/2021 | Wang | H10B 41/10 |
| 2022/0139821 A1* | 5/2022 | Hwang | H01L 25/0657 257/324 |

* cited by examiner

*Primary Examiner* — Michelle Mandala
(74) *Attorney, Agent, or Firm* — IP & T GROUP LLP

(57) ABSTRACT

A method for fabricating a vertical semiconductor device may include forming a lower-level stack including a source sacrificial layer over a semiconductor substrate; forming an upper-level stack including dielectric layers and sacrificial layers over the lower-level stack; forming a vertical channel structure including a channel layer that penetrates the upper-level stack and the lower-level stack; forming a slit that penetrates the upper-level stack while exposing the source sacrificial layer; forming a lateral recess that extends from the slit by removing the source sacrificial layer; forming a first contact layer which is coupled to a portion of the channel layer while filling the lateral recess; selectively forming a second contact layer over an exposed surface of the first contact layer; and selectively forming a chemical barrier layer over the second contact layer.

10 Claims, 20 Drawing Sheets

VERTICAL SEMICONDUCTOR DEVICE AND METHOD FOR FABRICATING THE SAME

CROSS-REFERENCE TO RELATED APPLICATIONS

The present application claims priority of Korean Patent Application No. 10-2021-0104829, filed on Aug. 9, 2021, which is incorporated herein by reference in its entirety.

BACKGROUND

1. Field

Various embodiments of the present invention relate to a semiconductor device, and more particularly, to a vertical semiconductor device and a method for fabricating the vertical semiconductor device.

2. Description of the Related Art

In the fabrication of an electronic device, such as a semiconductor device, gap-filling is required for a three-dimensional structure or a high aspect ratio structure. Gap-filling of a high aspect ratio structure is performed, for example, in the fabrication of a vertical semiconductor device.

SUMMARY

Embodiments of the present invention are directed to gap-filling which is required for a three-dimensional structure or a high aspect ratio structure in the fabrication of an electronic device, such as a semiconductor device. Gap-filling of a high aspect ratio structure may be performed, for example, in the fabrication of a vertical semiconductor device.

In accordance with an embodiment of the present invention, a method for fabricating a vertical semiconductor device may include forming a lower-level stack including a source sacrificial layer over a semiconductor substrate; forming an upper-level stack including dielectric layers and sacrificial layers over the lower-level stack; forming a vertical channel structure including a channel layer that penetrates the upper-level stack and the lower-level stack; forming a slit that penetrates the upper-level stack while exposing the source sacrificial layer; forming a lateral recess that extends from the slit by removing the source sacrificial layer; forming a first contact layer which is coupled to a portion of the channel layer while filling the lateral recess; selectively forming a second contact layer over an exposed surface of the first contact layer; and selectively forming a chemical barrier layer over the second contact layer.

In accordance with another embodiment of the present invention, a method for fabricating a vertical semiconductor device may include forming a lower-level stack including a source sacrificial layer over a semiconductor substrate; forming an upper-level stack including dielectric layers and sacrificial layers over the lower-level stack; forming a vertical channel structure including a channel layer that penetrates the upper-level stack and the lower-level stack; forming a slit that penetrates the upper-level stack while exposing the source sacrificial layer; forming a lateral recess that extends from the slit by removing the source sacrificial layer; forming a contact layer which is coupled to a portion of the channel layer while filling the lateral recess; selectively forming a chemical barrier layer over an exposed surface of the contact layer; and replacing the sacrificial layers of the upper-level stack with gate electrodes.

In accordance with yet another embodiment of the present invention, a vertical semiconductor device may include an alternating stack in which dielectric layers and gate electrodes over a semiconductor substrate are alternately stacked; a vertical channel layer that penetrates the alternating stack and a source channel contact layer; a source channel contact layer positioned between the semiconductor substrate and the alternating stack and coupled to the vertical channel layer; and a chemical barrier layer over the source channel contact layer.

According to the embodiments of the present invention, exposure of voids may be prevented because a source contact layer is formed by selective polysilicon growth. In addition, the expansion of voids caused by bending in a subsequent process may be controlled.

Also, according to the embodiments of the present invention, penetration of a chemical may be blocked in a subsequent process because a chemical barrier layer is formed by a selective deposition method. Accordingly, disconnection of a channel layer may be prevented.

DETAILED DESCRIPTION

Figure 1:
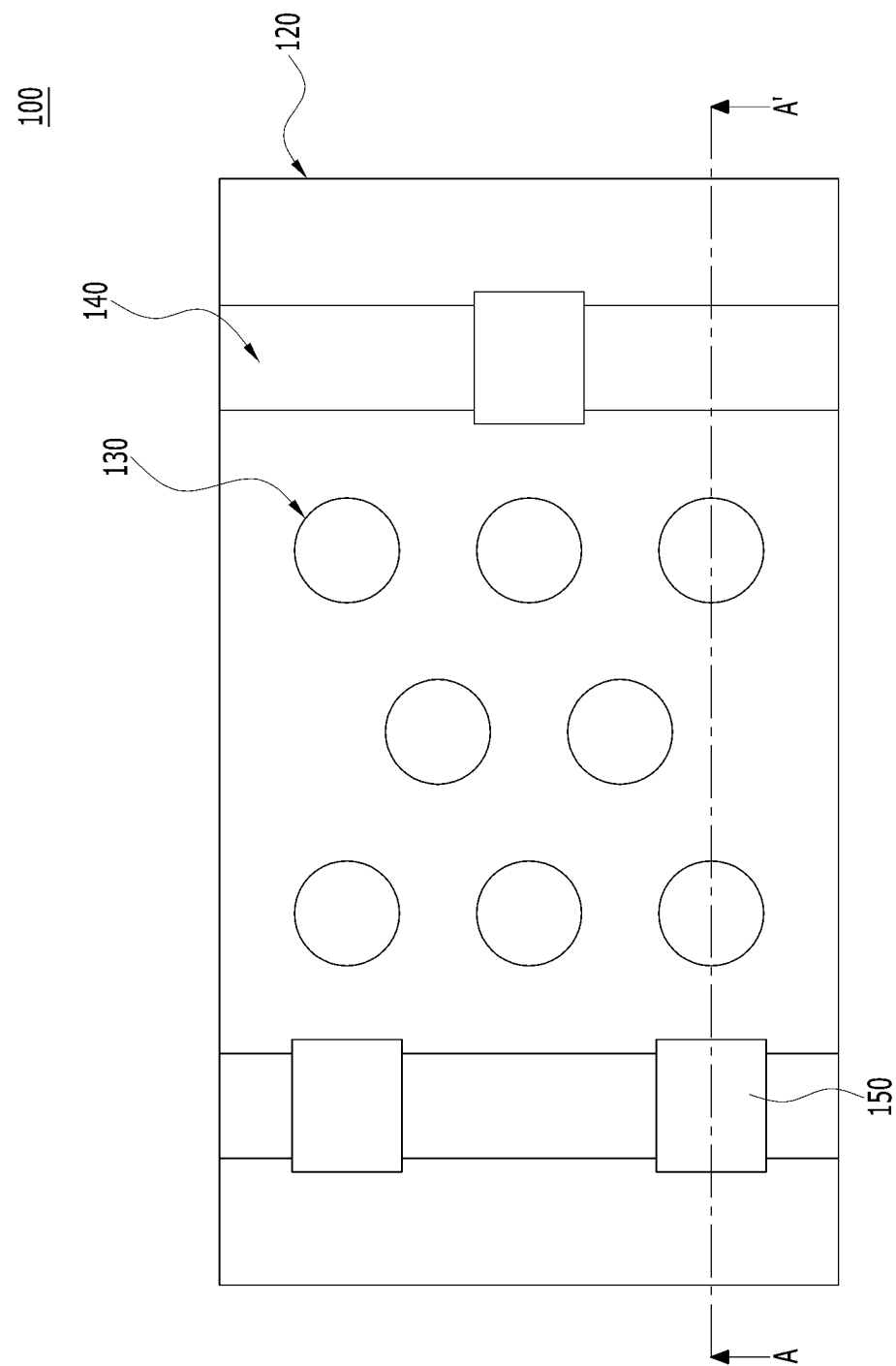
FIGS. 1 and 2 are diagrams illustrating a vertical semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2:
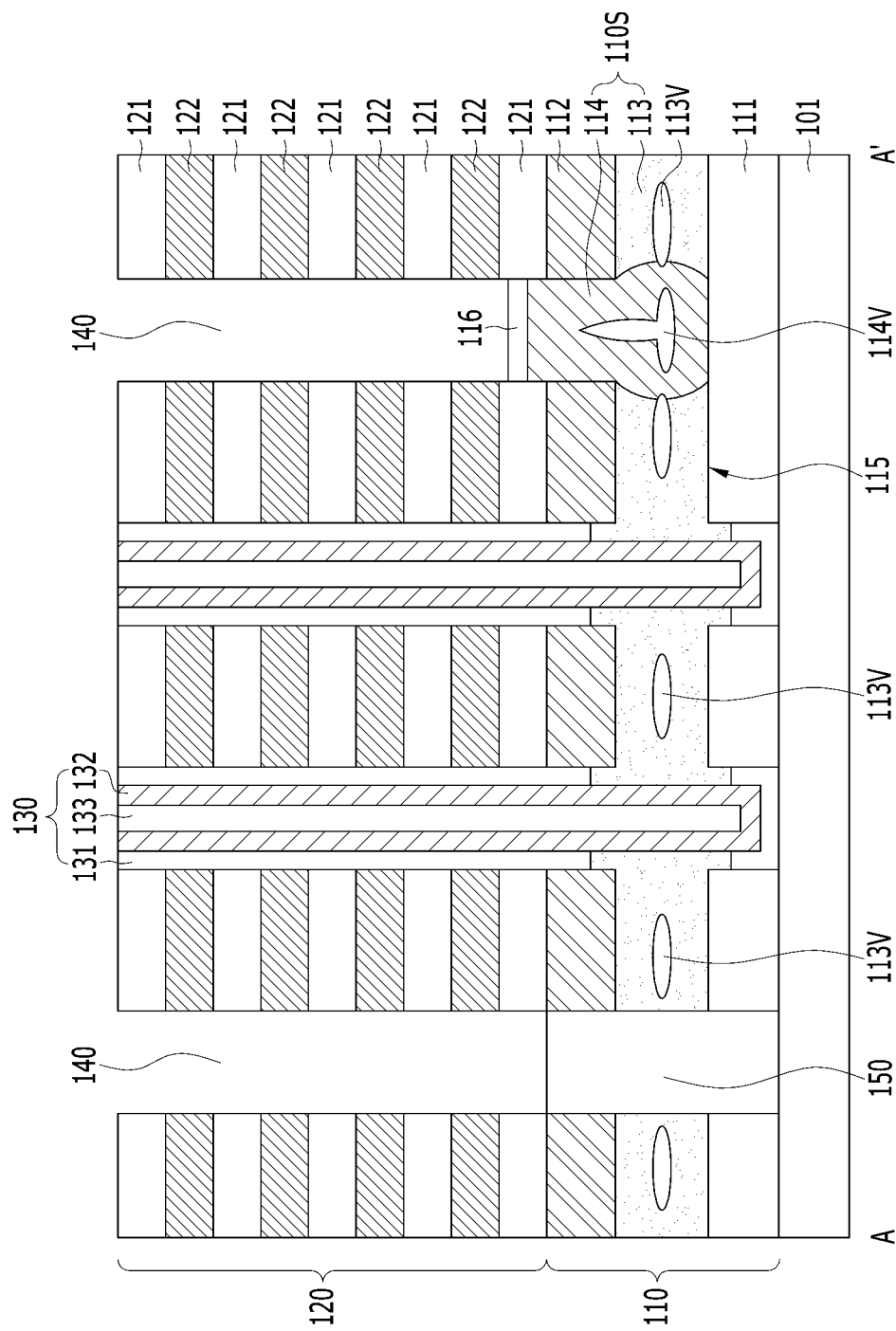

FIGS. 1 and 2 are diagrams illustrating a vertical semiconductor device in accordance with an embodiment of the present invention. FIG. 2 is a cross-sectional view taken along a line A-A' of FIG. 1.

Referring to FIGS. 1 and 2, the vertical semiconductor device 100 may include a semiconductor substrate 101, a lower-level stack 110 formed over the semiconductor substrate 101, and an alternating stack 120 over the lower-level stack 110. The lower-level stack 110 may include source layers 111 and 112 and a source channel contact layer 110S.

In the alternating stack 120, dielectric layers 121 and gate electrodes 122 may be alternately stacked. The lowermost dielectric layer among the dielectric layers 121 may be thicker than the other dielectric layers. The dielectric layers 121 may include silicon oxide, and the gate electrodes 122 may include a metal-based material. The gate electrodes 122 may include tungsten or a stack of titanium nitride and tungsten.

The vertical semiconductor device 100 may further include a vertical channel structure 130 penetrating the alternating stack 120. The vertical channel structure 130 may include a memory layer 131, a channel layer 132, and a core dielectric layer 133. The core dielectric layer 133 may fill an inner space of the channel layer 132, and the memory layer 131 may surround an outer wall of the channel layer 132. A lower portion of the vertical channel structure 130 may penetrate the lower-level stack 110 to land on the semiconductor substrate 101. An upper portion of the vertical channel structure 130 may penetrate the alternating stack 120.

The vertical semiconductor device 100 may further include a slit 140 penetrating the alternating stack 120. The slit 140 may be spaced apart from the vertical channel structure 130. The slit 140 may have a trench shape. A plurality of supporters 150 may be formed in the slit 140. The supporters 150 may have a shape of a pillar penetrating the lower-level stack 110. From the perspective of a top view, the slit 140 may have a trench shape, and the supporters 150 may penetrate the lower-level stack 110 below the slit 140. The supporters 150 may include a dielectric material.

The lower-level stack 110 may be described in detail hereinafter.

The lower-level stack 110 may include source layers 111 and 112 and a source channel contact layer 110S disposed between the source layers 111 and 112. The source layers 111 and 112 may include a lower source layer 111 and an upper source layer 112. The lower-level stack 110 may further include a lateral recess 115, and the lateral recess 115 may be defined between the lower source layer 111 and the upper source layer 112. The source channel contact layer 110S may be formed between the lower source layer 111 and the upper source layer 112. A portion of the source channel contact layer 110S may fill the lateral recess 115. The lower source layer 111 and the upper source layer 112 may be formed of the same material, and may include a semiconductor material, such as polysilicon. The source channel contact layer 110S may include a semiconductor material, such as silicon.

The source channel contact layer 110S may include a first silicon layer 113 and a second silicon layer 114. The first silicon layer 113 may fill the lateral recess 115. The first silicon layer 113 may directly contact the channel layer 132 of the vertical channel structure 130. The second silicon layer 114 may extend to fill a portion of the slit 140 while contacting sidewalls of the first silicon layer 113.

The first silicon layer 113 and the second silicon layer 114 may be silicon layers having different crystal phases. The first silicon layer 113 may be a crystalline silicon layer, and the second silicon layer 114 may be a monocrystalline silicon layer. The first silicon layer 113 may be a polysilicon layer, and the second silicon layer 114 may be an epitaxial polysilicon layer.

The first silicon layer 113 may be a deposition-type polysilicon layer, and the second silicon layer 114 may be formed by selective polysilicon growth (SPG). The first silicon layer 113 and the second silicon layer 114 may include a dopant. The dopant may include phosphorus. The first silicon layer 113 and the second silicon layer 114 may include phosphorus (P)-doped polysilicon.

The second silicon layer 114 may be selectively grown from the exposed surfaces of the first silicon layer 113, the lower source layer 111, and the upper source layer 112.

A chemical barrier layer 116 may be formed on the exposed surface of the second silicon layer 114 inside the slit 140. The chemical barrier layer 116 may be silicon oxide. The chemical barrier layer 116 may be thinner than the second silicon layer 114. The chemical barrier layer 116 may be silicon oxide formed by selective deposition.

The first silicon layer 113 may include a first void 113V. The second silicon layer 114 may include a second void 114V. According to variation of the described embodiment of the present invention, the first void 113V and the second void 114V may be omitted.

As described above, the contact surface of the first silicon layer 113 and the second silicon layer 114 may include an oxide-free surface. The chemical barrier layer 116 may be selectively deposited on the surface of the second silicon layer 114.

FIGS. 3 to 13 are cross-sectional views illustrating an example of a method for fabricating a vertical semiconductor device in accordance with an embodiment of the present invention. Hereinafter, FIGS. 3 to 13 may be cross-sectional views taken along a line A-A' of FIG. 1.

Figure 3:
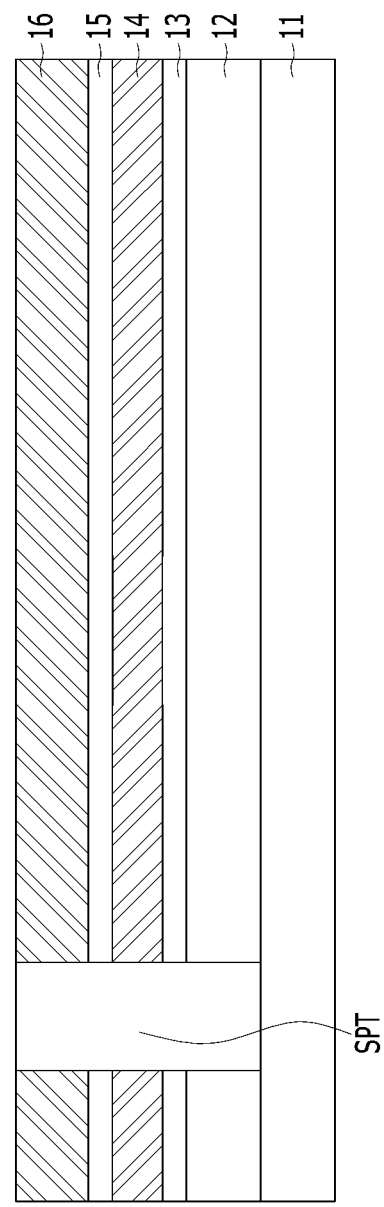
FIGS. 3 to 13 are cross-sectional views illustrating a method for fabricating a vertical semiconductor device in accordance with an embodiment of the present invention.

Referring to FIG. 3, a lower-level stack structure including a lower source layer 12, an upper source layer 16, liner layers 13 and 15, and a source sacrificial layer 14 may be formed over a semiconductor substrate 11. The source sacrificial layer 14 may be formed between the lower source layer 12 and the upper source layer 16. The liner layers 13 and 15 may be formed between the source sacrificial layer 14 and the lower/upper source layers 12 and 16. The lower source layer 12, the source sacrificial layer 14, and the upper source layer 16 may be formed of the same material, and the liner layers 13 and 15 may include a material which is different from the lower source layer 12, the source sacrificial layer 14, and the upper source layer 16. The lower source layer 12, the source sacrificial layer 14, and the upper source layer 16 may have an etch selectivity with respect to the liner layers 13 and 15. The lower source layer 12, the source sacrificial layer 14, and the upper source layer 16 may include a semiconductor material, and the liner layers 13 and 15 may include a dielectric material. The lower source layer 12, the source sacrificial layer 14, and the upper source layer 16 may include polysilicon, and the liner layers 13 and 15 may include silicon oxide. The liner layers 13 and 15 may be thinner than the lower source layer 12, the source sacrificial layer 14, and the upper source layer 16. The source sacrificial layer 14 may be thinner than each of the lower and upper source layers 12 and 16.

Subsequently, a supporter SPT penetrating the lower source layer 12, the upper source layer 16, the liner layers 13 and 15, and the source sacrificial layer 14 may be formed. In order to form the supporter SPT, the lower source layer 12, the upper source layer 16, the liner layers 13 and 15, and the source sacrificial layer 14 may be etched to form a through hole, and then the through hole may be filled with a dielectric material. The supporter SPT may include silicon oxide ($SiO_2$), silicon nitride ($Si_3N_4$), or silicon (Si). It should be understood that although FIG. 3 shows one supporter, the method is not limited in this way and a plurality of supporters SPT may be formed.

Figure 4:
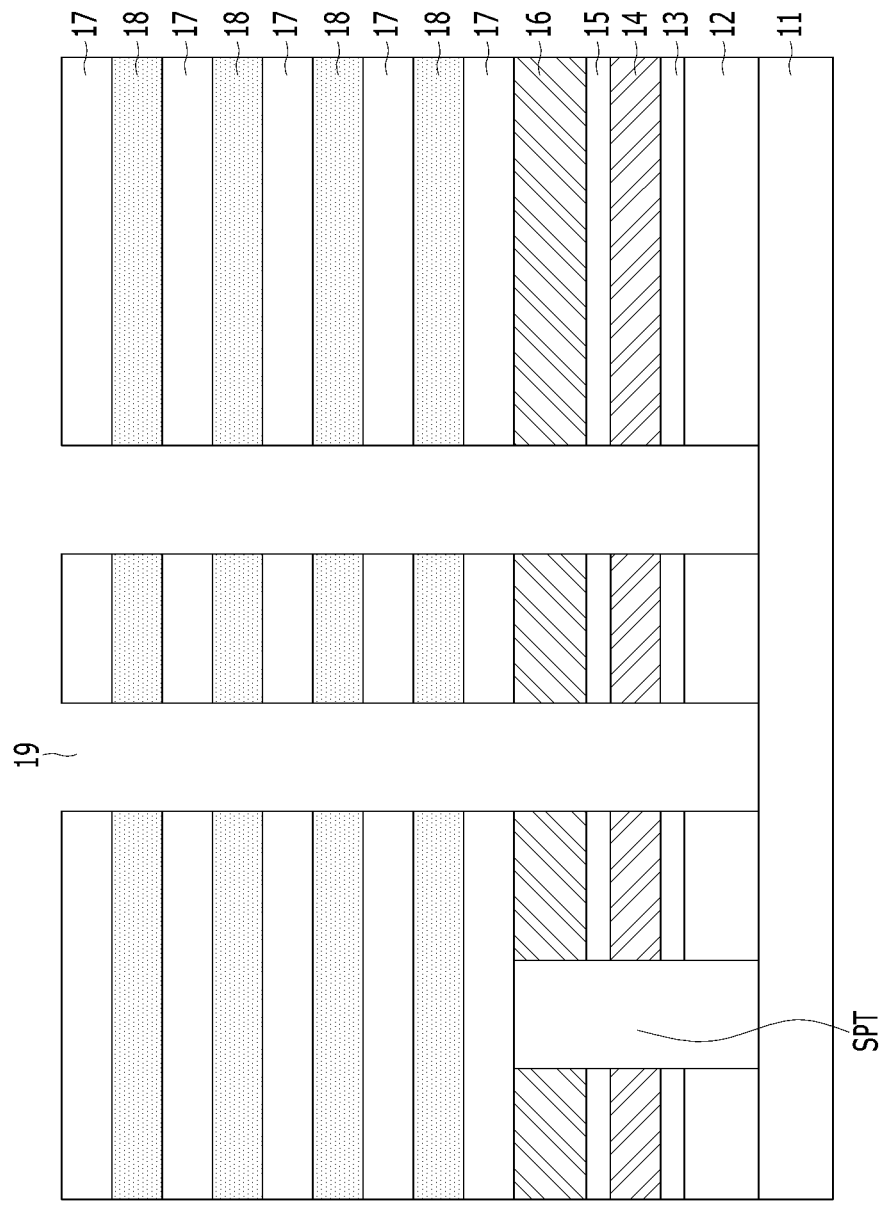

Referring to FIG. 4, an upper-level stack including dielectric layers 17 and sacrificial layers 18 may be formed over the supporter SPT and the upper source layer 16. In the upper-level stack, the dielectric layers 17 and the sacrificial layers 18 may be alternately stacked. The dielectric layers 17 and the sacrificial layers 18 may be alternately stacked several times. The dielectric layers 17 and the sacrificial layers 18 may be formed of different materials. The dielectric layers 17 may have an etch selectivity with respect to the sacrificial layers 18. The dielectric layers 17 may include silicon oxide, and the sacrificial layers 18 may include silicon nitride. The dielectric layers 17 and the sacrificial layers 18 may have the same thickness.

The dielectric layers 17 and the sacrificial layers 18 may be thicker than the liner layers 13 and 15, and the dielectric layers 17 and the sacrificial layers 18 may be thinner than the lower source layer 12 and the upper source layer 16. The lowermost dielectric layer 17 among the dielectric layers 17 may be thicker than the other dielectric layers 17.

The dielectric layers 17 and the sacrificial layers 18 may be formed by Chemical Vapor Deposition (CVD) or Atomic Layer Deposition (ALD).

Subsequently, vertical openings 19 may be formed. The vertical openings 19 may be formed by etching the dielectric layers 17, the sacrificial layers 18, the upper source layer 16, the liner layers 13 and 15, the source sacrificial layer 14, and the lower source layer 12.

The vertical openings 19 may be formed perpendicular to the surface of the semiconductor substrate 11. The vertical openings 19 may have a shape penetrating the dielectric layers 17 and the sacrificial layers 18, and the vertical openings 19 may extend to penetrate the upper source layer 16, the liner layers 13 and 15, the source sacrificial layer 14, and the lower source layer 12. Although not illustrated, from the perspective of a plan view, a plurality of vertical openings 19 may be formed and may have a hole array structure. When the vertical openings 19 are formed, a surface of the semiconductor substrate 101 may be recessed. According to another embodiment of the present invention, the vertical openings 19 may be referred to as a 'vertical recesses, vertical holes, or channel holes'.

Figure 5:
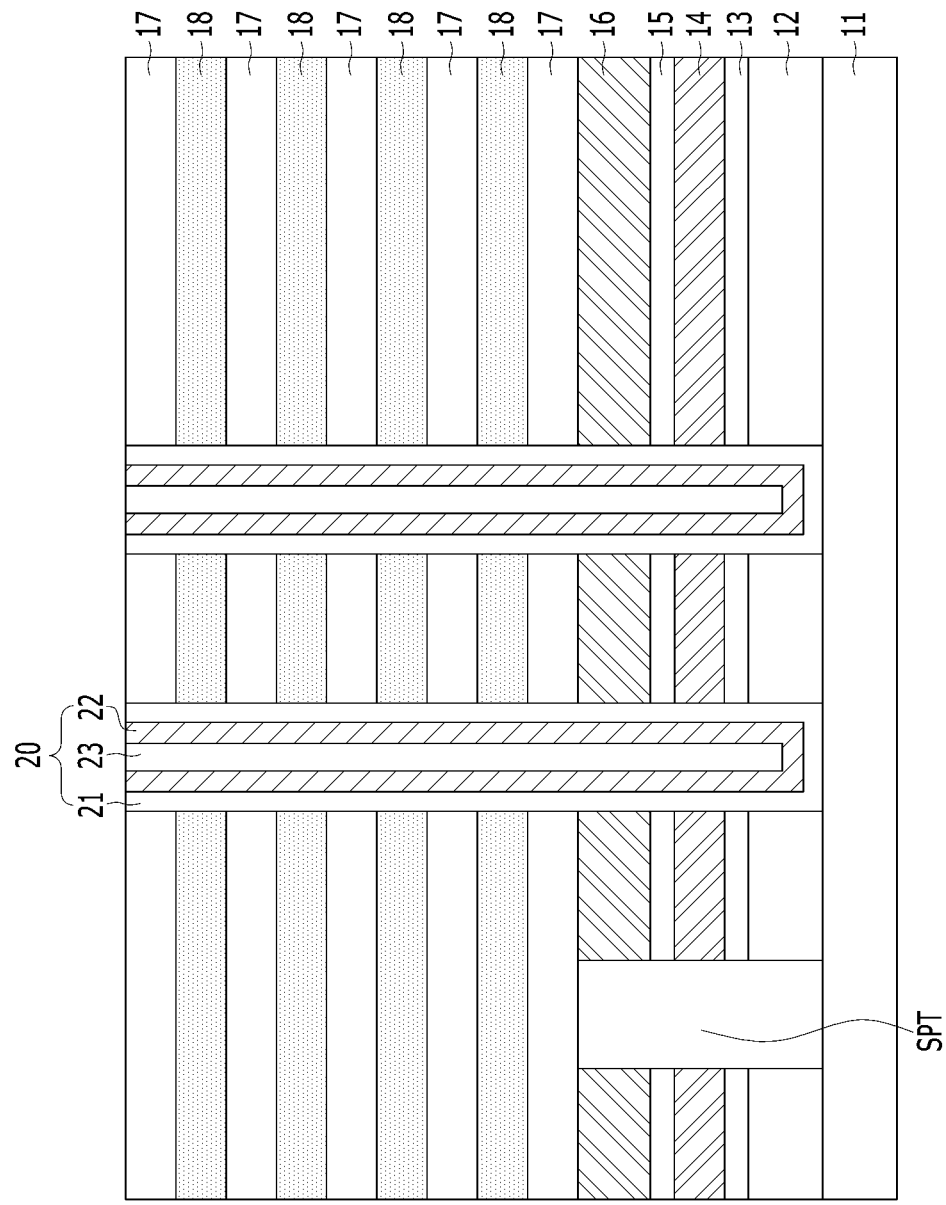

Referring to FIG. 5, a vertical channel structure 20 may be formed in each of the vertical openings 19. The vertical channel structure 20 may fill the vertical opening 19. The vertical channel structure 20 may be referred to as a 'pillar structure'.

The vertical channel structure 20 may include a memory layer 21, a channel layer 22, and a core dielectric layer 23. The memory layer 21 may have a stack structure including a blocking layer, a charge trapping layer, and a tunnel dielectric layer. The blocking layer and the tunnel dielectric layer may include an oxide, and the charge trapping layer may include a nitride. The memory layer 21 may have an oxide-nitride-oxide (ONO) structure. The channel layer 22 may include an undoped polysilicon layer to which no impurity is added. The channel layer 22 may have a cylinder shape having an inner space. A memory layer 21 may surround an outer wall of the channel layer 22. An inner space of the channel layer 22 may be completely filled with the core dielectric layer 23. The core dielectric layer 23 may include silicon oxide or silicon nitride.

Figure 6:
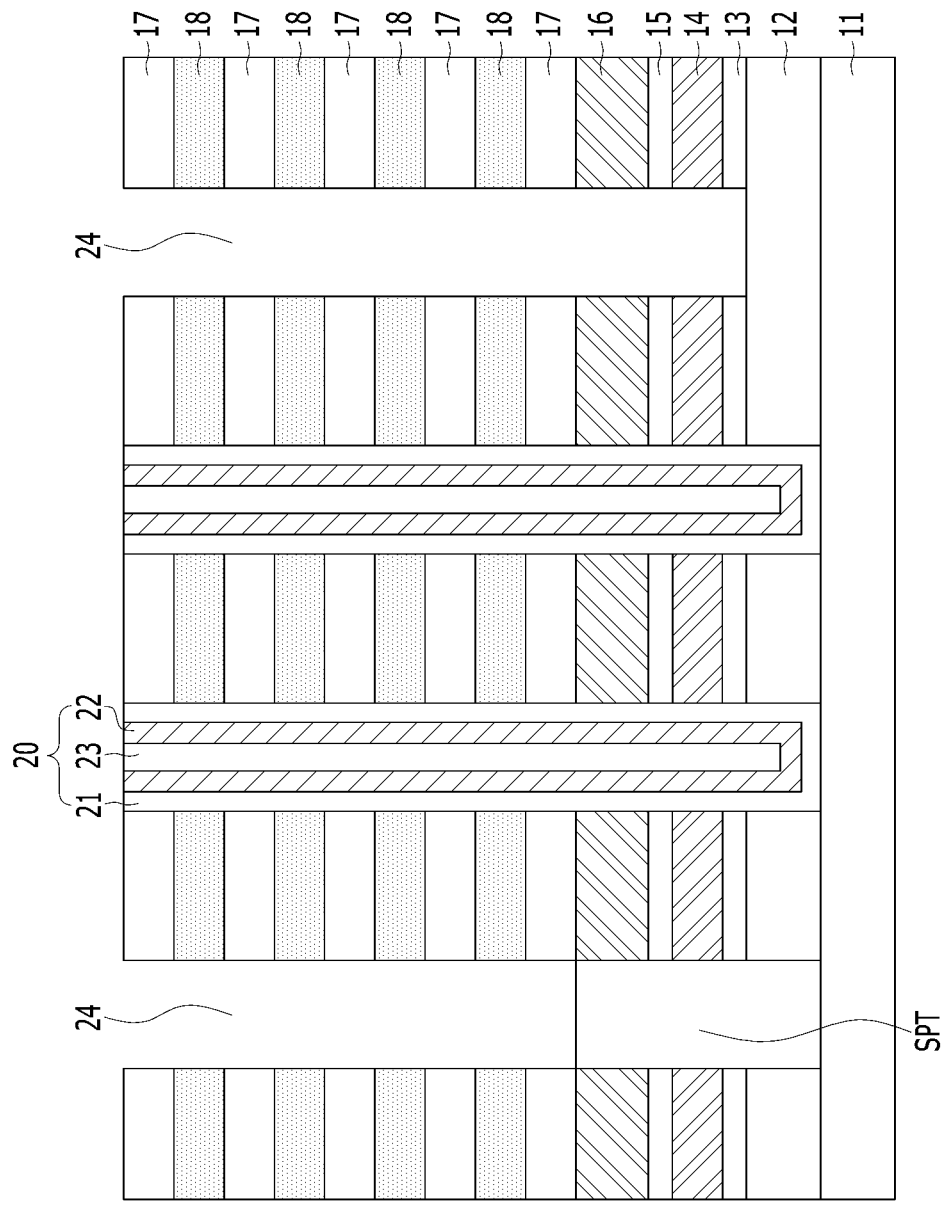

Referring to FIG. 6, a slit 24 may be formed. The slit 24 may be formed by etching the dielectric layers 17 and the sacrificial layers 18. Subsequently, the upper source layer 16, the source sacrificial layer 14, and the liner layers 13 and 15 may be etched to expose the lower source layer 12. The slit 24 may also be referred to as a trench.

From the perspective of a top view, the slit 24 may have a line shape extending in one direction. The slit 24 may be formed perpendicular to the surface of the semiconductor substrate 11. The slit 24 may be referred to as a vertical slit.

Portions of the supporters SPT may be exposed below the slit 24. The supporters SPT may be spaced apart from each other in the direction that the slit 24 extends.

Figure 7:
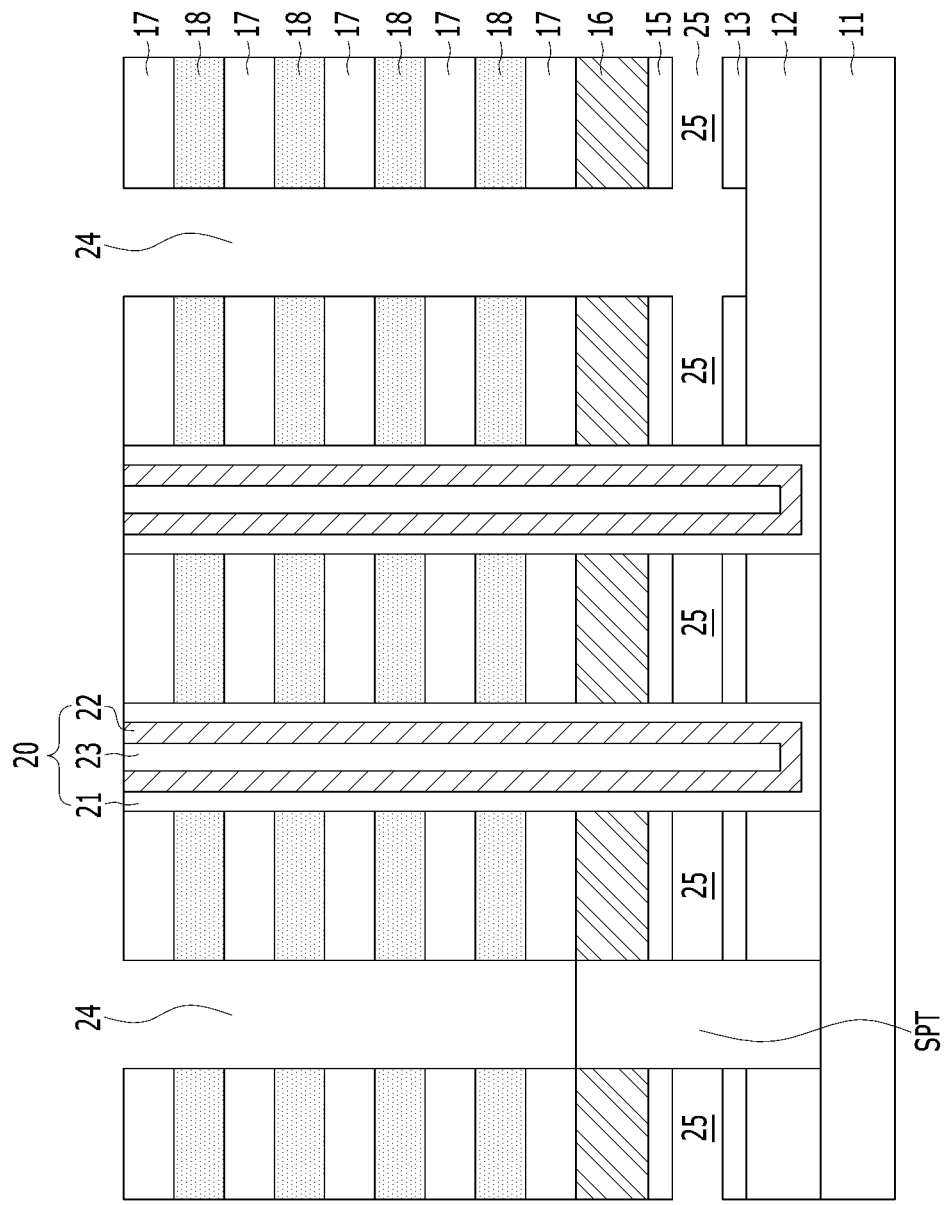

Referring to FIG. 7, the source sacrificial layer 14 may be selectively removed through the slit 24. As a result, the lateral recess 25 may be formed. The lateral recess 25 may extend from the slit 24. The lateral recess 25 may be formed between the liner layers 13 and 15 by removing the source sacrificial layer 14 by a dip-out process. The lateral recess 25 may be parallel to the surface of the semiconductor substrate 11. When the source sacrificial layer 14 is removed, the liner layers 13 and 15 may remain without being removed due to their etch selectivity. The lateral recess 25 may be formed between the lower source layer 12 and the upper source layer 16. When the source sacrificial layer 14 is removed, the lower source layer 12 and the upper source layer 16 may not be removed. Wet etching may be applied to remove the source sacrificial layer 14. Since the source sacrificial layer 14 includes a polysilicon layer, the wet etching may include a chemical capable of etching the polysilicon layer.

The lateral recess 25 may expose a lower sidewall of the vertical channel structures 20. An outer wall of the vertical channel structures 20 may be a portion of the memory layer 21. From the perspective of a top view, the lateral recess 25 may have a shape surrounding the lower sidewall of the vertical channel structure 20.

Figure 8:
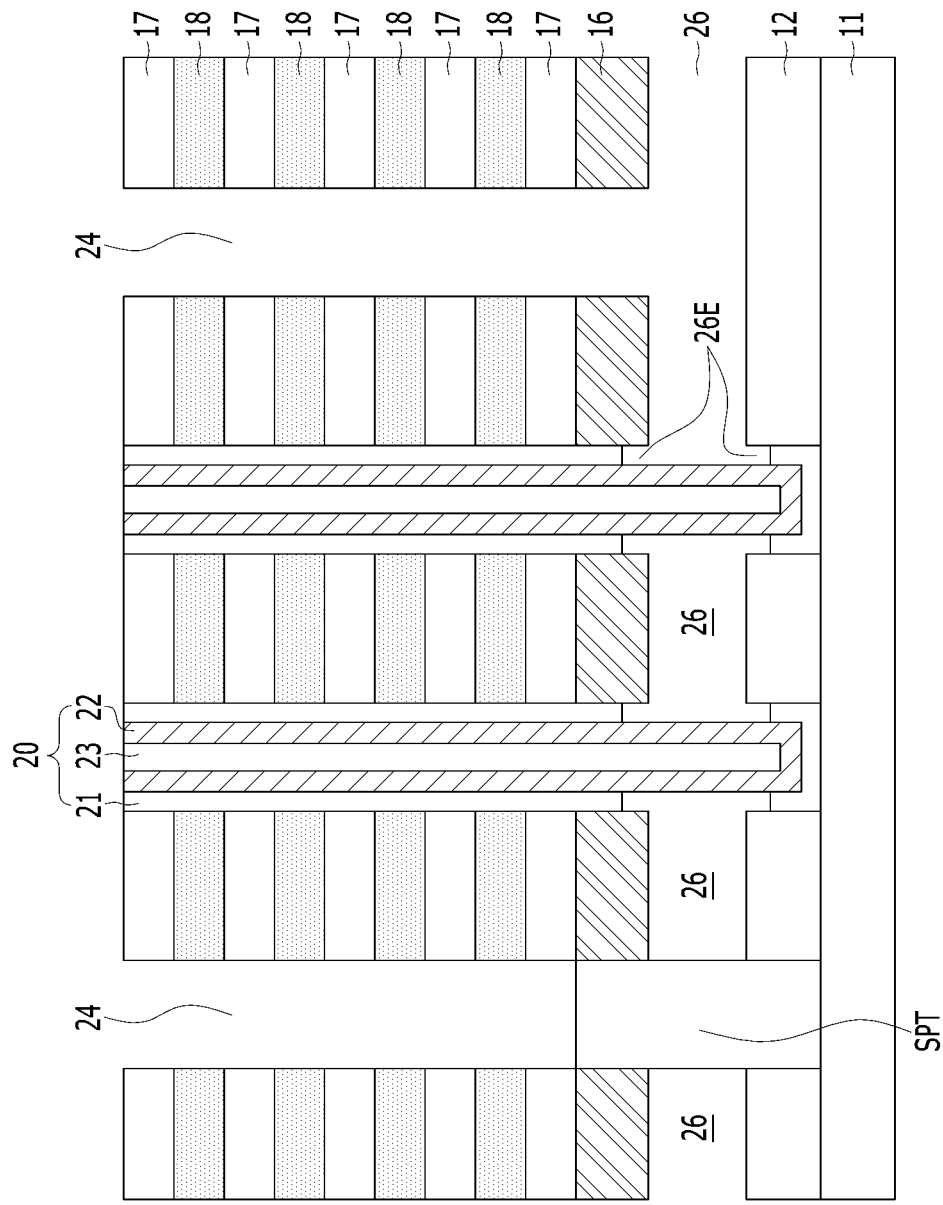

Referring to FIG. 8, the liner layers 13 and 15 may be removed. As a result, the volume of the lateral recess 25 may be increased. A lateral recess having an expanded volume may thus be formed as indicated by reference numeral '26'.

After the liner layers 13 and 15 are removed, a portion of the memory layer 21 of the vertical channel structure 20 may be removed.

Through a series of the processes described above, the lateral recess 26 may expose the lower outer wall of the channel layer 22. A portion of the memory layer 21 may be cut by the lateral recess 26. Accordingly, an undercut 26E may be formed between the channel layer 22 and the lower/upper source layers 12 and 16.

The lateral recess 26 may have a first surface parallel to the semiconductor substrate 11, and the slit 24 may extend from the lateral recess 26 and have a second surface perpendicular to the semiconductor substrate 11. In other words, a gap-fill target structure including the lateral recess 26 having the first surface and the slit 24 having the second surface may be formed over the semiconductor substrate 11. The first surface may be provided by the channel layer 22, the lower source layer 12, and the upper source layer 16, and the second surface may be provided by the sacrificial layers 18. The first surface may be a surface of the silicon layer, and the second surface may be a surface of a dielectric material.

Subsequently, the lateral recess 26 may be gap-filled with semiconductor materials through a series of processes.

Figure 9:
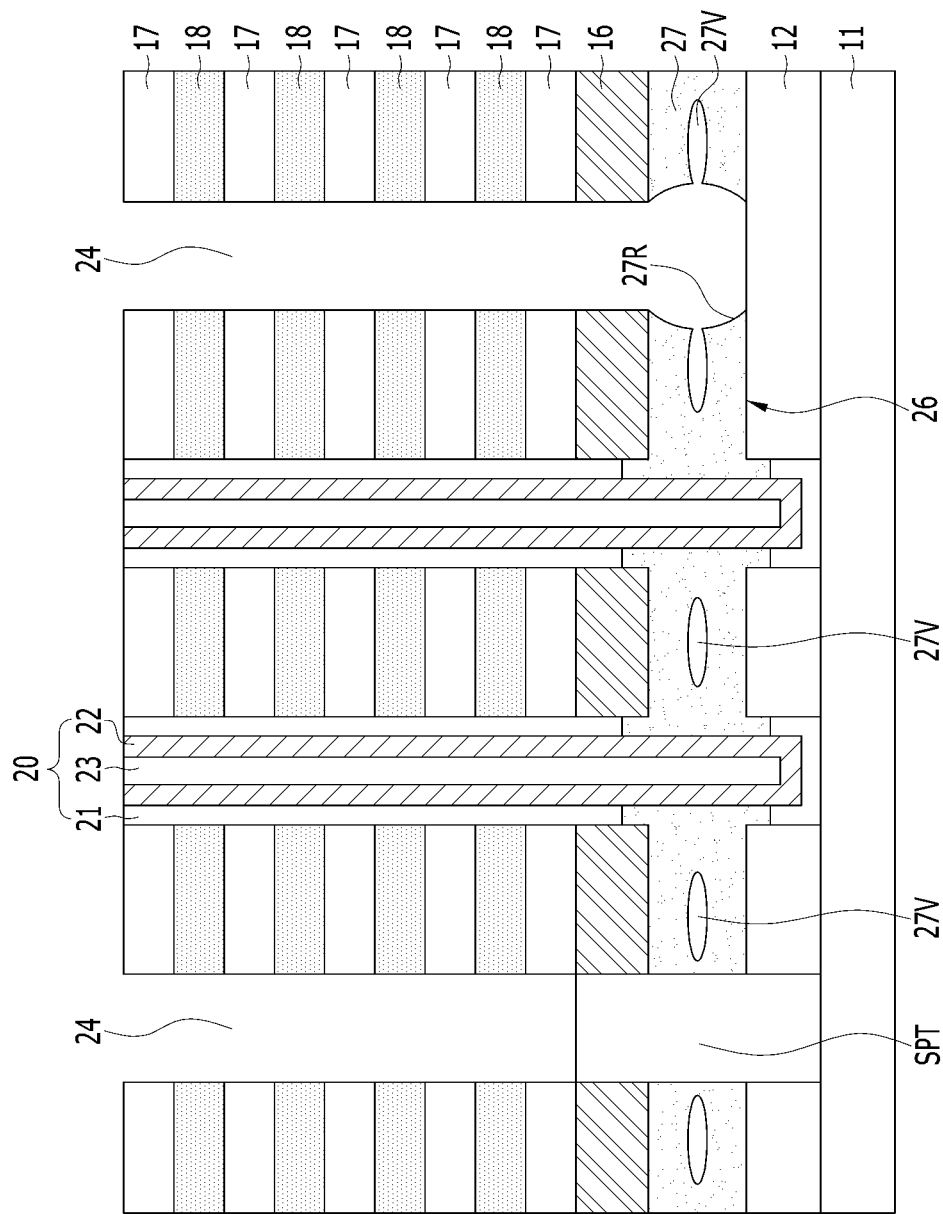

Referring to FIG. 9, a first contact layer 27 may be formed. The first contact layer 27 may be formed by a deposition process of a first semiconductor material. The first semiconductor material may include a polysilicon layer. For example, the polysilicon layer deposition process may be performed using a silicon source material. The silicon source material may include monosilane, disilane, or dichlorosilane ($SiH_2Cl_2$, DCS). The first contact layer 27 may include polysilicon. The first contact layer 27 may include a dopant. The dopant may include phosphorus. The first contact layer 27 may fill the undercut 26E of FIG. 8 without voids. When the first contact layer 27 is formed, an additional gas capable of etching silicon and silicon oxide, such as HCl and HF, may be further used. The additional gas may improve the gap-fill characteristic of the first contact layer 27. An inert gas, such as $N_2$, Ar, He, or $H_2$, may be used as a carrier gas and a purge gas for unreacted materials.

Subsequently, the first contact layer 27 may be selectively removed. The first contact layer 27 may be removed by using HBr gas. The first contact layer 27 may be completely removed from the slit 24.

As described above, the first contact layer 27 may remain in the lateral recess 26. The first contact layer 27 may include a first void 27V and an exposed surface 27R.

Figure 10:
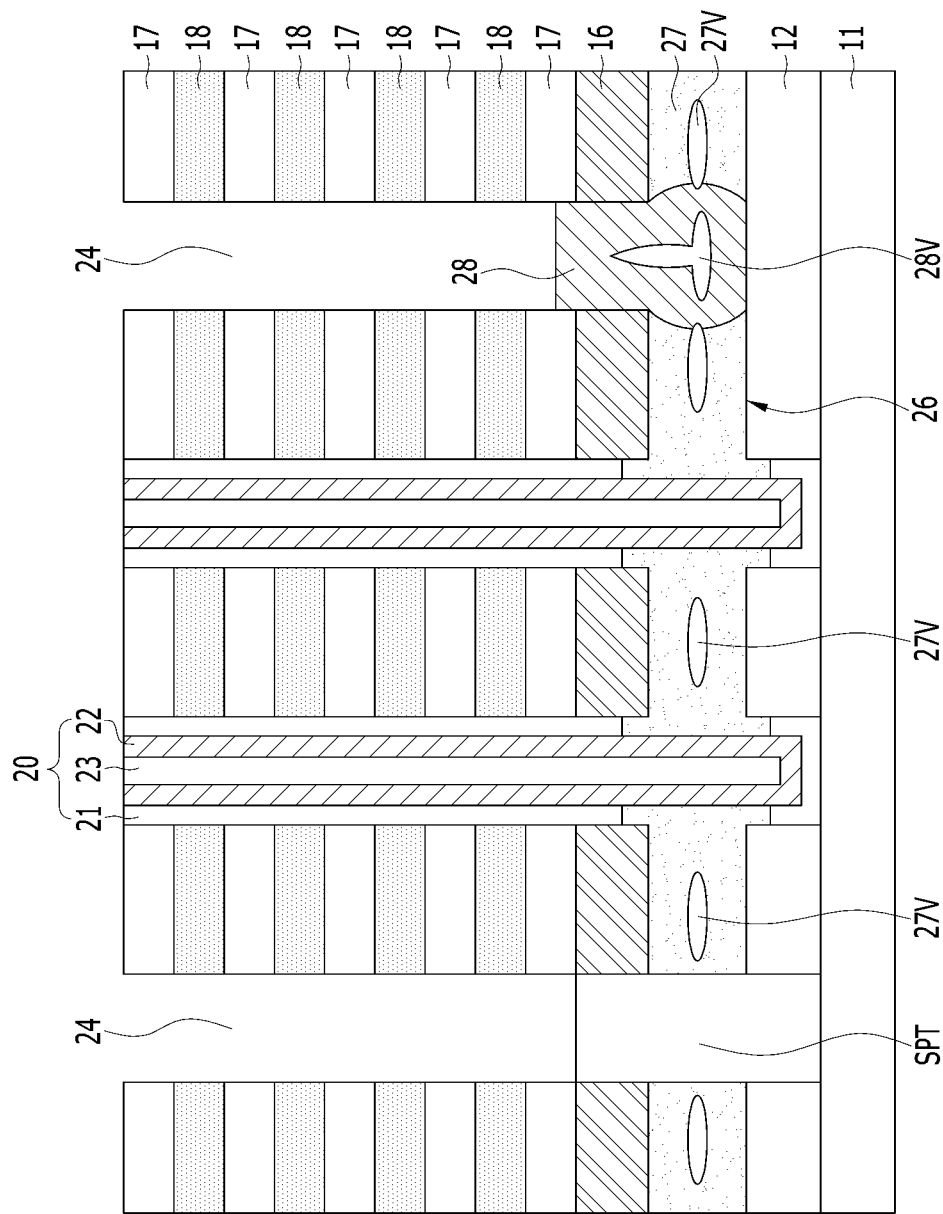

Referring to FIG. 10, a second contact layer 28 may be formed over the first contact layer 27. The second contact layer 28 may include a second semiconductor material. The second contact layer 28 may selectively grow from the exposed surface 27R of the first contact layer 27. In other words, the second contact layer 28 may be formed by selective polysilicon growth (SPG). The second contact layer 28 may include polysilicon. The second contact layer 28 may include a dopant. For example, the dopant may include phosphorus. The second contact layer 28 may include a phosphorus (P)-doped epitaxial polysilicon layer. The second contact layer 28 may include a second void 28V. The second contact layer 28 may selectively grow from the surfaces of the lower source layer 12 and the upper source layer 16.

The selective growth process of the second contact layer 28 may be performed at a low-pressure process of approximately 550° C. or higher.

For example, the selective growth process of the polysilicon layer may be performed by using a silicon source material. The silicon source material may include monosilane (MS), disilane (DS), or dichlorosilane ($SiH_2Cl_2$, DCS). The second contact layer 28 may include polysilicon. The second contact layer 28 may include a dopant. The dopant may include phosphorous. When the second contact layer 28 is formed, an additional gas capable of etching silicon and silicon oxide, such as HCl and HF, may be further used. The additional gas may improve the gap-fill characteristics of the second contact layer 28. An inert gas, such as $N_2$, Ar, He, or $H_2$, may be used as a carrier gas and a purge gas for unreacted materials.

As a comparative example, the second contact layer 28 may be formed by Chemical Vapor Deposition (CVD). However, in the case of the chemical vapor deposition, relatively large voids may be formed while filling the slit 24. Conversely, according to the embodiment of the present invention, since the second contact layer 28 is formed by Selective Polysilicon Growth (SPG), the size of the second void 28V may be reduced. When the size of the second void 28V is reduced, disconnection of the second contact layer 28 may be prevented in a subsequent process.

Through a series of the processes described above, the lateral recess 26 may be filled with the first contact layer 27 and the second contact layer 28. The slit 24 may be partially filled with the second contact layer 28. The top surface of the second contact layer 28 may be positioned at a higher level than the top surface of the upper source layer 16.

Figure 11:
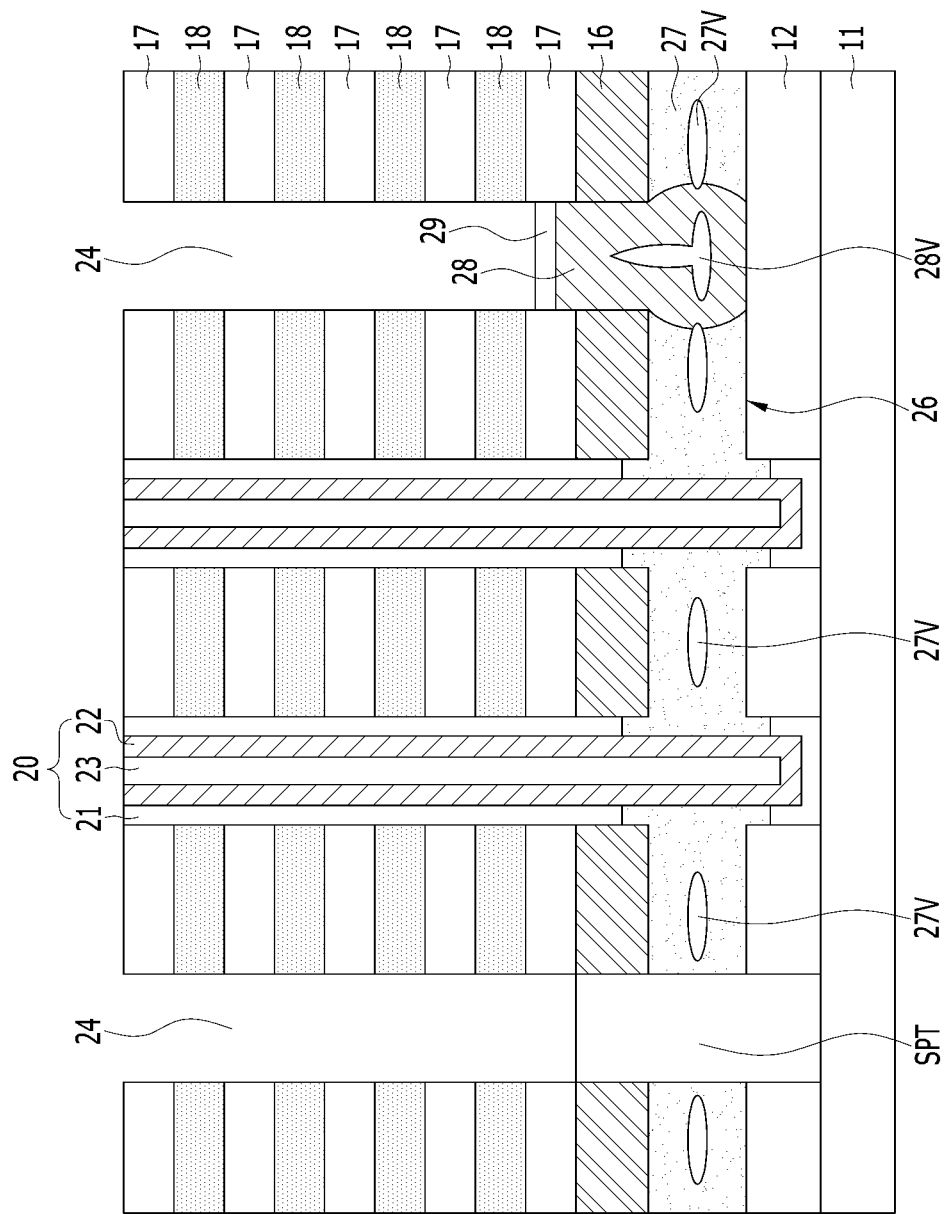

Referring to FIG. 11, a chemical barrier layer 29 may be formed over the second contact layer 28. The chemical barrier layer 29 may have an etch selectivity with respect to the sacrificial layers 18. The chemical barrier layer 29 may include an oxide. For example, the chemical barrier layer 29 may include silicon oxide. The silicon oxide may be selectively formed from the surface of the second contact layer 28. For example, the chemical barrier layer 29 may be formed by an Area Selective Deposition (ASD) process. The ASD process may refer to a method of selectively depositing a selected surface of the second contact layer 28. When the chemical barrier layer 29 is deposited by the ASD process, deposition may be suppressed on the surface of an oxide and a nitride. For example, the chemical barrier layer 29 may not be deposited on the surfaces of the dielectric layers 17 and the sacrificial layers 18.

Selective silicon oxide deposition (ASD $SiO_2$) for forming the chemical barrier layer 29 may be performed at a temperature of approximately 25° C. or higher and at a low pressure by using plasma. The selective silicon oxide deposition may be performed by using a silicon source material. The silicon source material may include monosilane (MS), dichlorosilane (DCS), disilane (DS), hexachlorodisilane (HCDS), Bisdiethylaminosilane (BDEAS), Bistertiarybutylaminosilane (BTBAS), or Tridimethylaminosilane (TDMAS). Also, the selective silicon oxide deposition may use a source material including silicon (Si) and a SiO bond. For the selective silicon oxide deposition, a source material having N, F, Cl, H bonds, such as $NF_3$, $NH_3$, $F_2$, $Cl_2$, $H_2$, and $N_2$, may be used for profile and selective deposition.

According to another embodiment of the present invention, the chemical barrier layer 29 may be formed by selectively oxidizing the exposed surface of the second contact layer 28.

Figure 12:
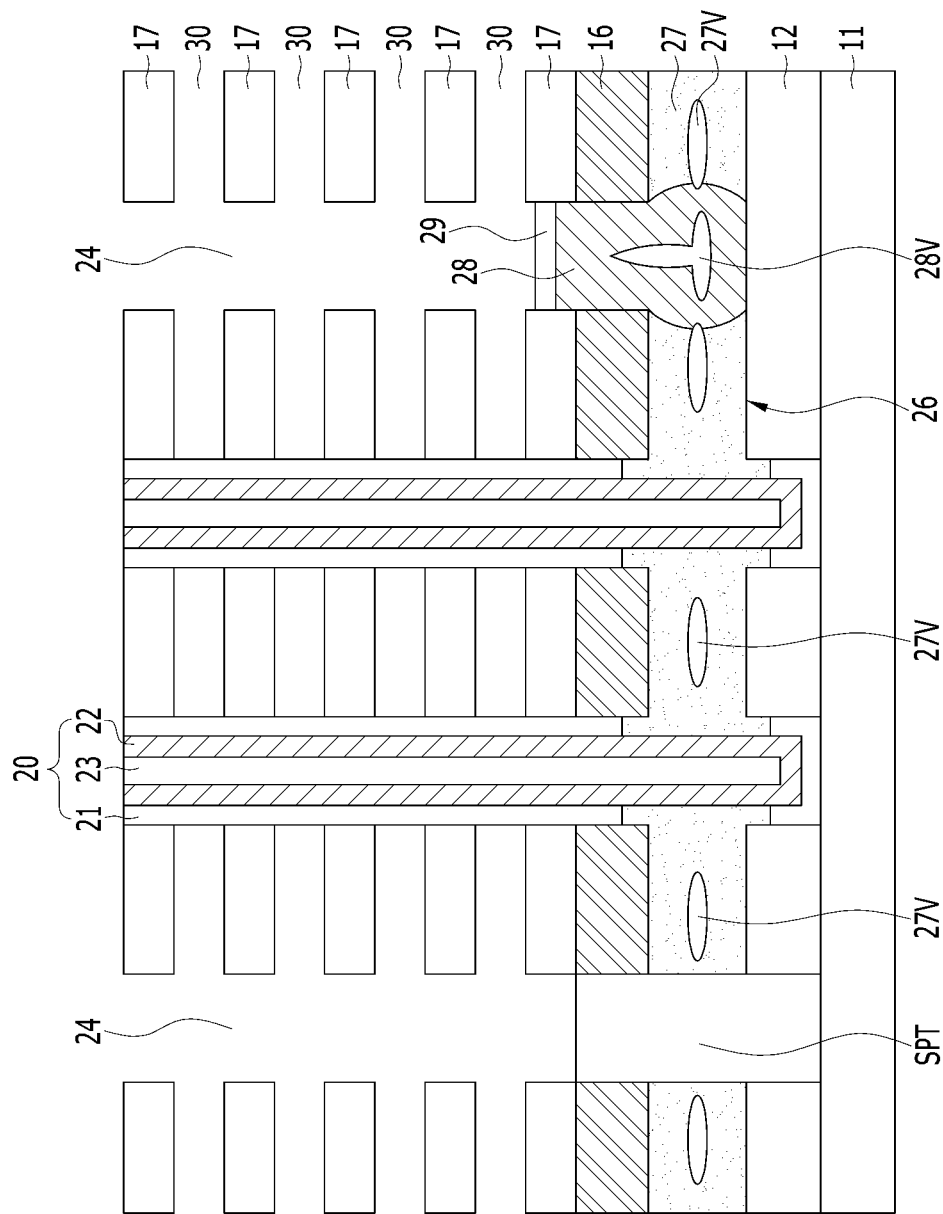
Figure 13:
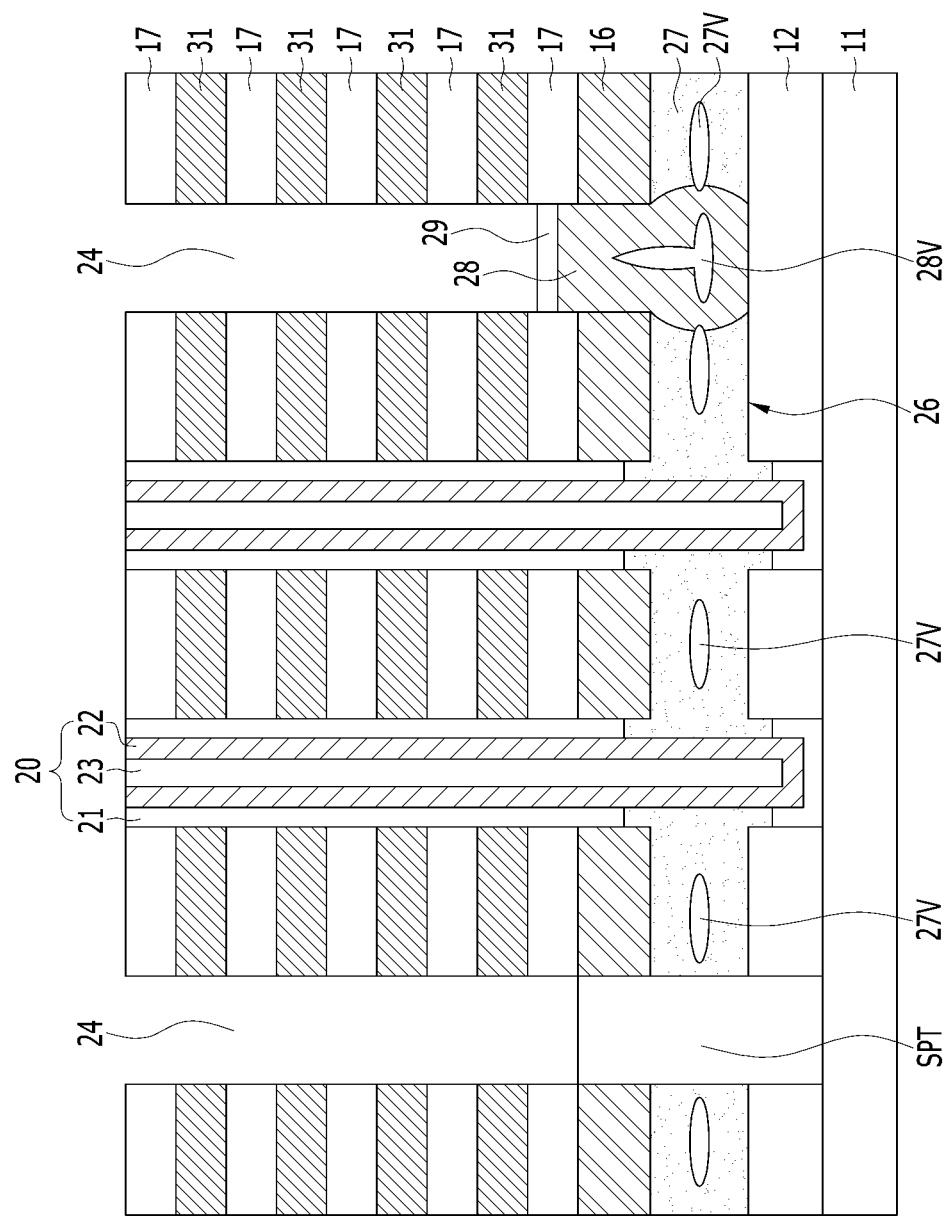

Referring to FIGS. 12 and 13, the sacrificial layer 18 may be replaced with gate electrodes 31.

First, Referring to FIG. 12, the sacrificial layers 18 may be selectively removed. As a result, gate recesses 30 may be formed between the dielectric layers 17. The sacrificial layers 18 may be removed by using phosphoric acid ($H_3PO_4$). While the sacrificial layers 18 are removed by using phosphoric acid, the chemical barrier layer 29 may not be removed due to its etch selectivity.

The second contact layer 28 may be protected by the chemical barrier layer 29 while the sacrificial layers 18 are removed. Accordingly, the chemical barrier layer 29 may prevent the second void 28V from being exposed.

As described above, according to the embodiment of the present invention, since the chemical barrier layer 29 is formed over the second contact layer 28, penetration of the phosphoric acid may be prevented.

Referring to FIG. 13, gate electrodes 31 may be formed in the gate recesses 30. The gate electrodes 31 may include titanium nitride, tungsten, or a combination thereof.

FIGS. 14 to 17 are cross-sectional views illustrating a method for fabricating a vertical semiconductor device in accordance with another embodiment of the present invention. In FIGS. 14 to 17, the same reference numerals also appearing in FIGS. 3 to 13 designate similar components. Hereinafter, detailed descriptions on the components also appearing in FIGS. 3 to 13 may be omitted.

First, a first contact layer 27 partially filling a lateral recess 26 may be formed by a series of the processes shown in FIGS. 3 to 9. The first contact layer 27 may include a first void 27V.

Figure 14:
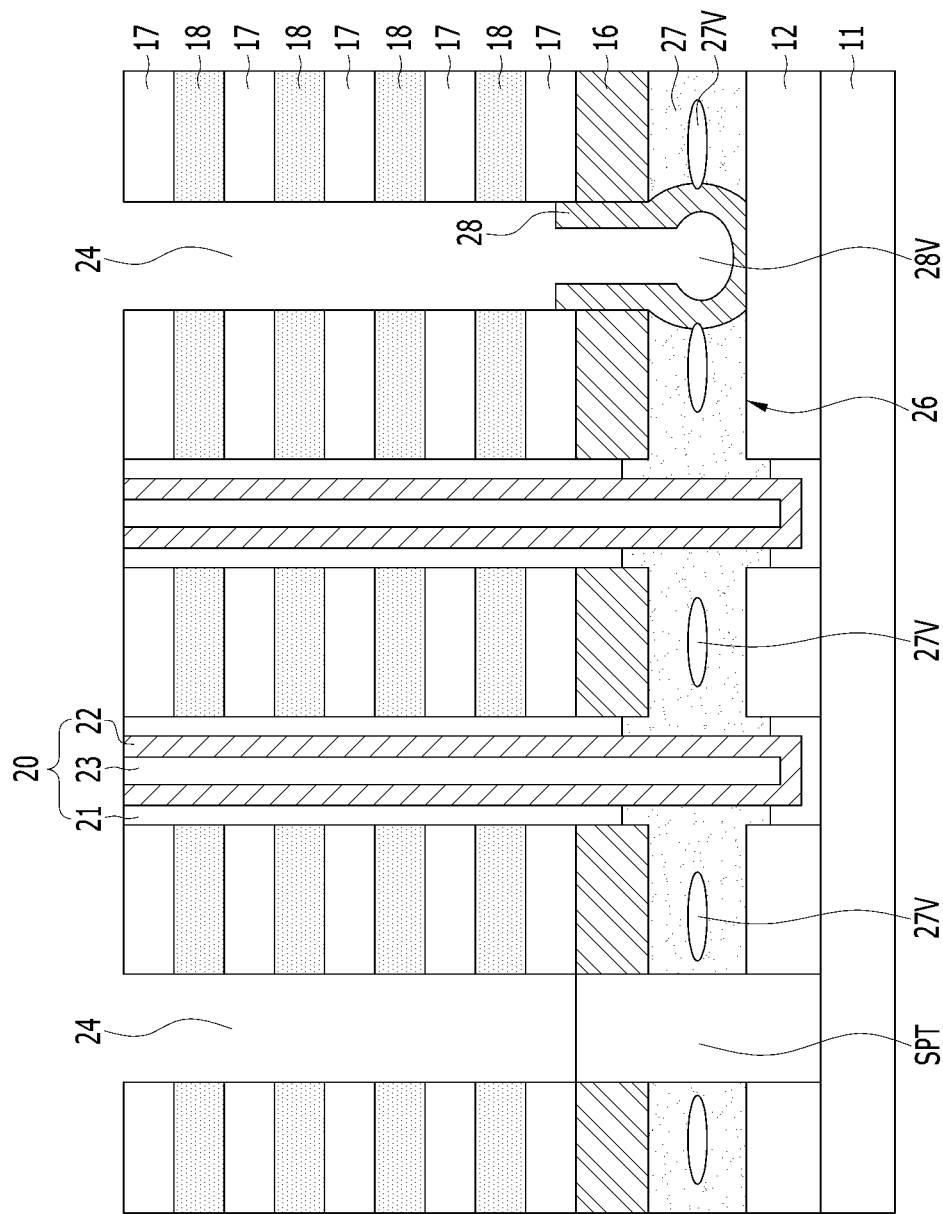
FIGS. 14 to 17 are cross-sectional views illustrating a method for fabricating a vertical semiconductor device in accordance with another embodiment of the present invention.

Referring to FIG. 14, a second contact layer 28 may be conformally formed over the first contact layer 27. The second contact layer 28 may include a second semiconductor material. The second contact layer 28 may be selectively grown from an exposed surface 27R of the first contact layer 27. The second contact layer 28 may be formed by selective polysilicon growth (SPG). The second contact layer 28 may include polysilicon. The second contact layer 28 may include a dopant. For example, the dopant may include phosphorous. The second contact layer 28 may include a phosphorous (P)-doped epitaxial polysilicon layer. The second contact layer 28 may include a second void 28V. The second contact layer 28 may be selectively grown from the exposed surface of the first contact layer 27. Also, the second contact layer 28 may be selectively grown from the surfaces of a lower source layer 12 and an upper source layer 16.

According to the embodiment of the present invention, since the second contact layer 28 is formed by selective polysilicon growth (SPG), the size of the second void 28V may be reduced. When the size of the second void 28V is reduced, disconnection of the second contact layer 28 may be prevented in a subsequent process.

Through a series of the processes described above, the lateral recess 26 may be filled with the first contact layer 27. The slit 24 may be partially filled with the second contact layer 28. For example, the bottom surfaces of the slit 24 may be covered by the conformal second contact layer 28.

Figure 15:
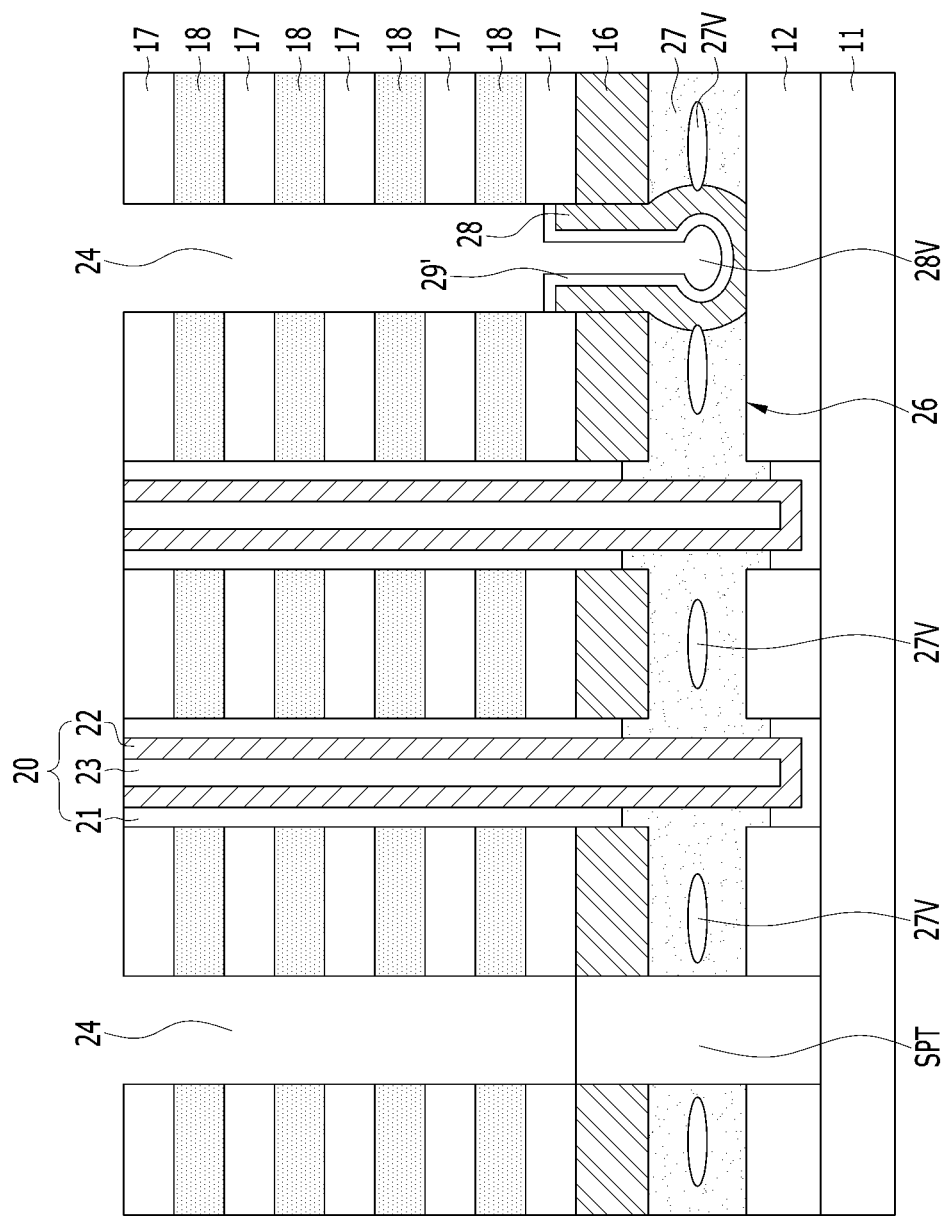

Referring to FIG. 15, a chemical barrier layer 29' may be formed conformally over the second contact layer 28. The chemical barrier layer 29' may have an etch selectivity with respect to the dielectric layers 17 and the sacrificial layers 18. The chemical barrier layer 29' may include an oxide. For example, the chemical barrier layer 29' may include ASD-type silicon oxide, and the ASD-type silicon oxide may be selectively deposited on the surface of the second contact layer 28.

The chemical barrier layer 29' may be conformally formed on the exposed surface of the second contact layer 28. As a result, the second void 28V of the second contact layer 28 may not be filled with the chemical barrier layer 29'.

According to another embodiment of the present invention, the chemical barrier layer 29' may be formed by selectively oxidizing the exposed surface of the second contact layer 28.

Figure 16:
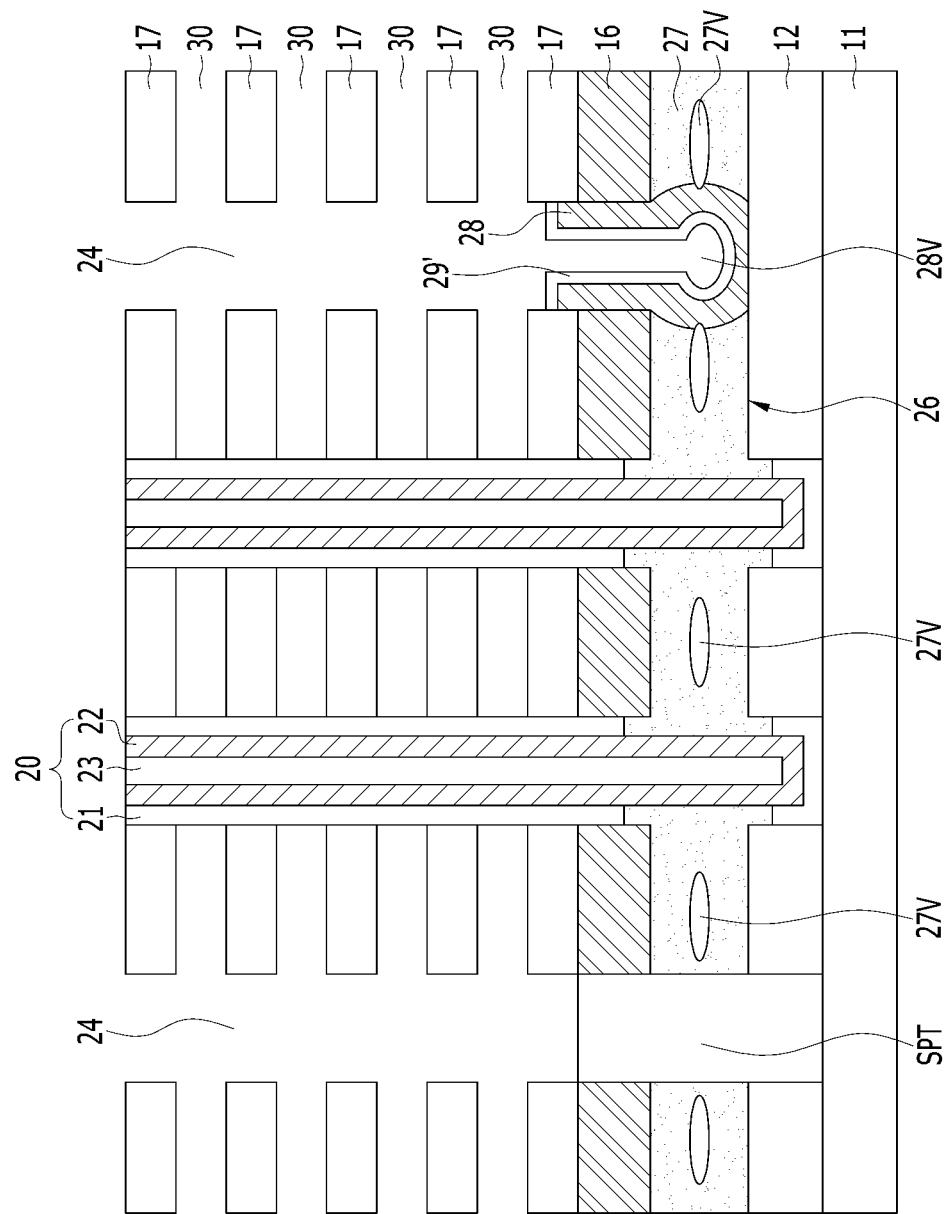
Figure 17:
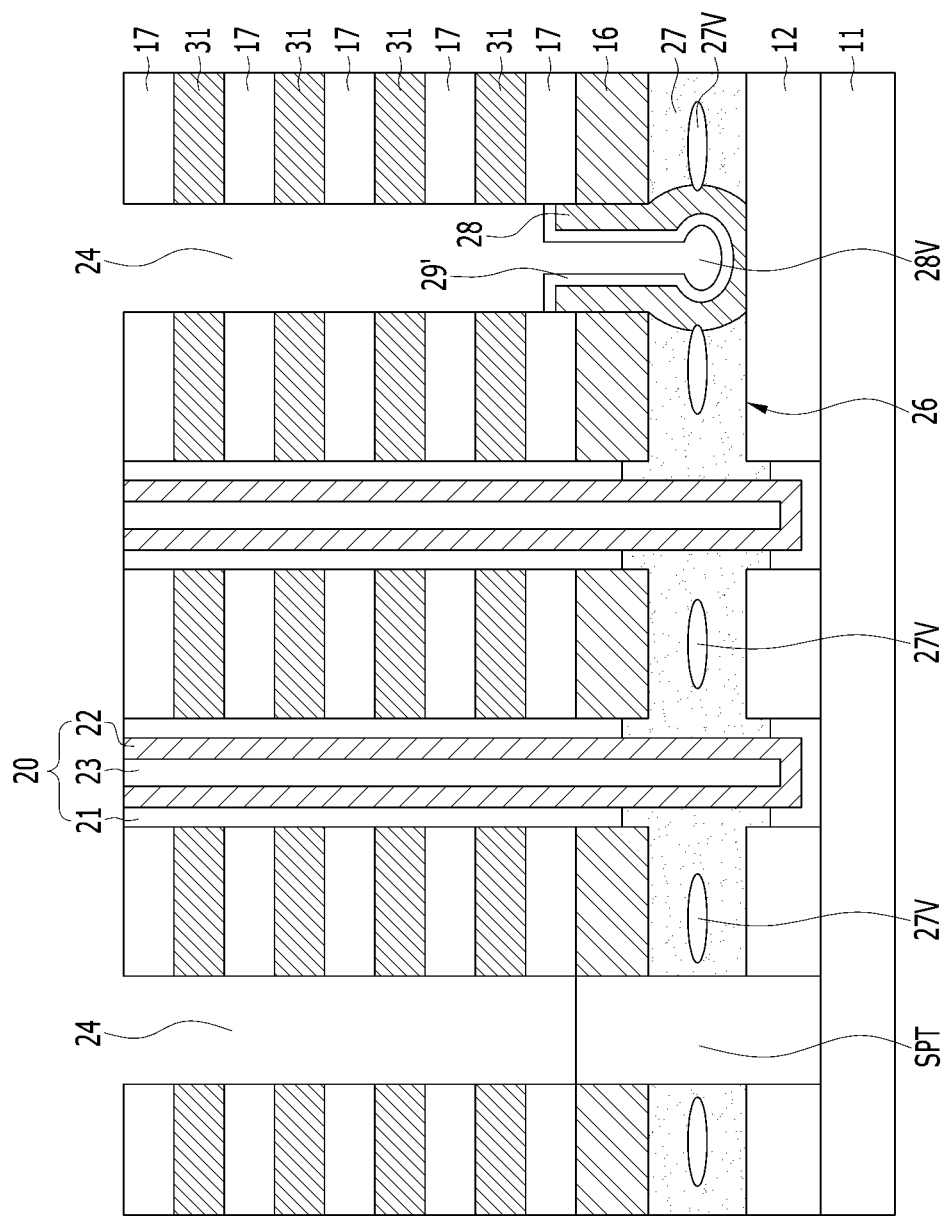

Referring to FIGS. 16 and 17, the sacrificial layers 18 may be replaced with the gate electrodes 31.

First, referring to FIG. 16, the sacrificial layers 18 may be selectively removed. As a result, gate recesses 30 may be formed between the dielectric layers 17. The sacrificial layers 18 may be removed by using phosphoric acid ($H_3PO_4$). While the sacrificial layers 18 are removed by using phosphoric acid, the chemical barrier layer 29' may not be removed due to its etch selectivity.

The first contact layer 27 and the second contact layer 28 may be protected by the chemical barrier layer 29' while the sacrificial layers 18 are removed. Accordingly, the chemical barrier layer 29' may protect the first void 27V from being exposed.

As described above, according to the embodiment of the present invention, since the chemical barrier layer 29' is formed over the second contact layer 28, the penetration of phosphoric acid may be prevented.

Referring to FIG. 17, gate electrodes 31 may be formed in the gate recesses 30. The gate electrodes 31 may include titanium nitride, tungsten, or a combination thereof.

Figure 18:
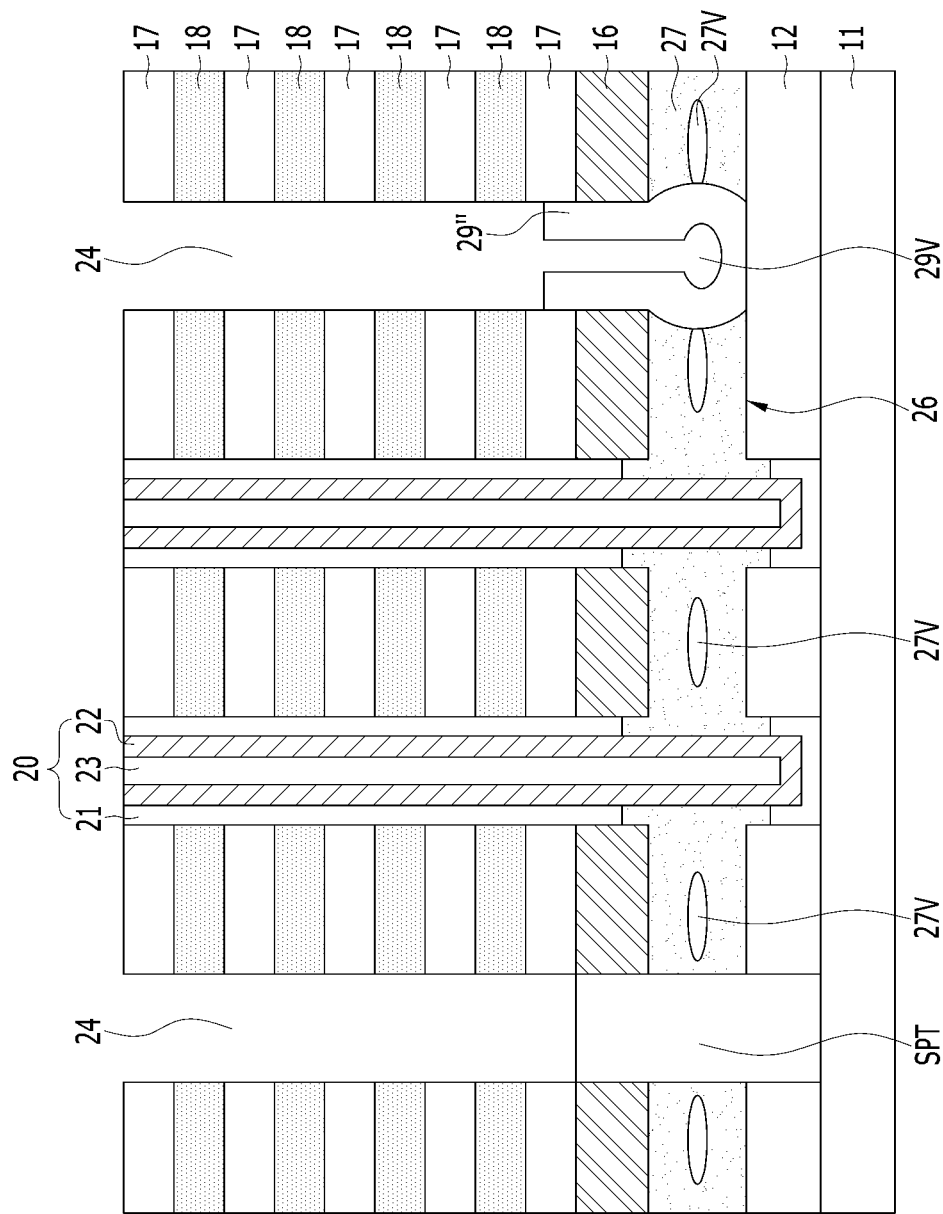
FIGS. 18 to 20 are cross-sectional views illustrating a method for fabricating a vertical semiconductor device in accordance with another embodiment of the present invention.
Figure 19:
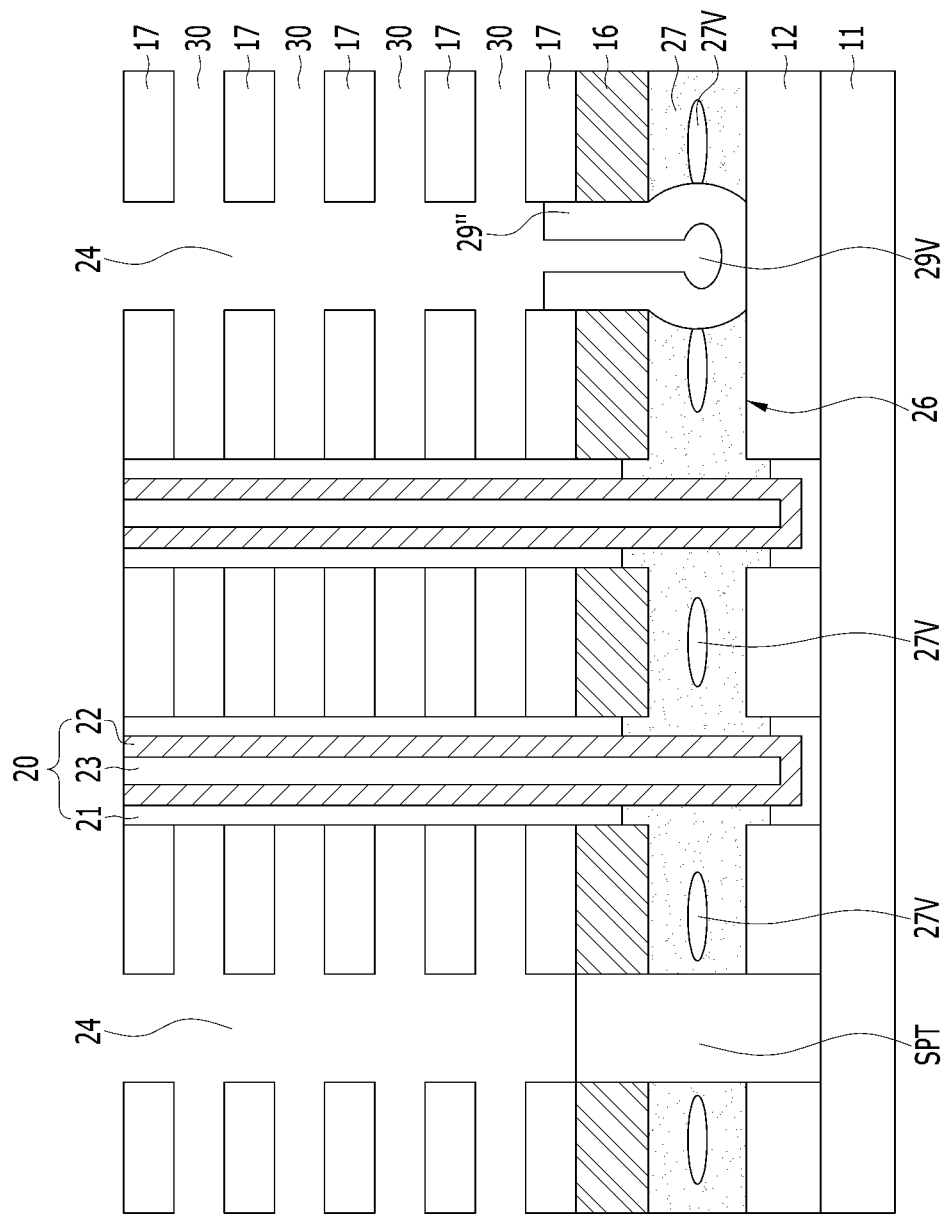
Figure 20:
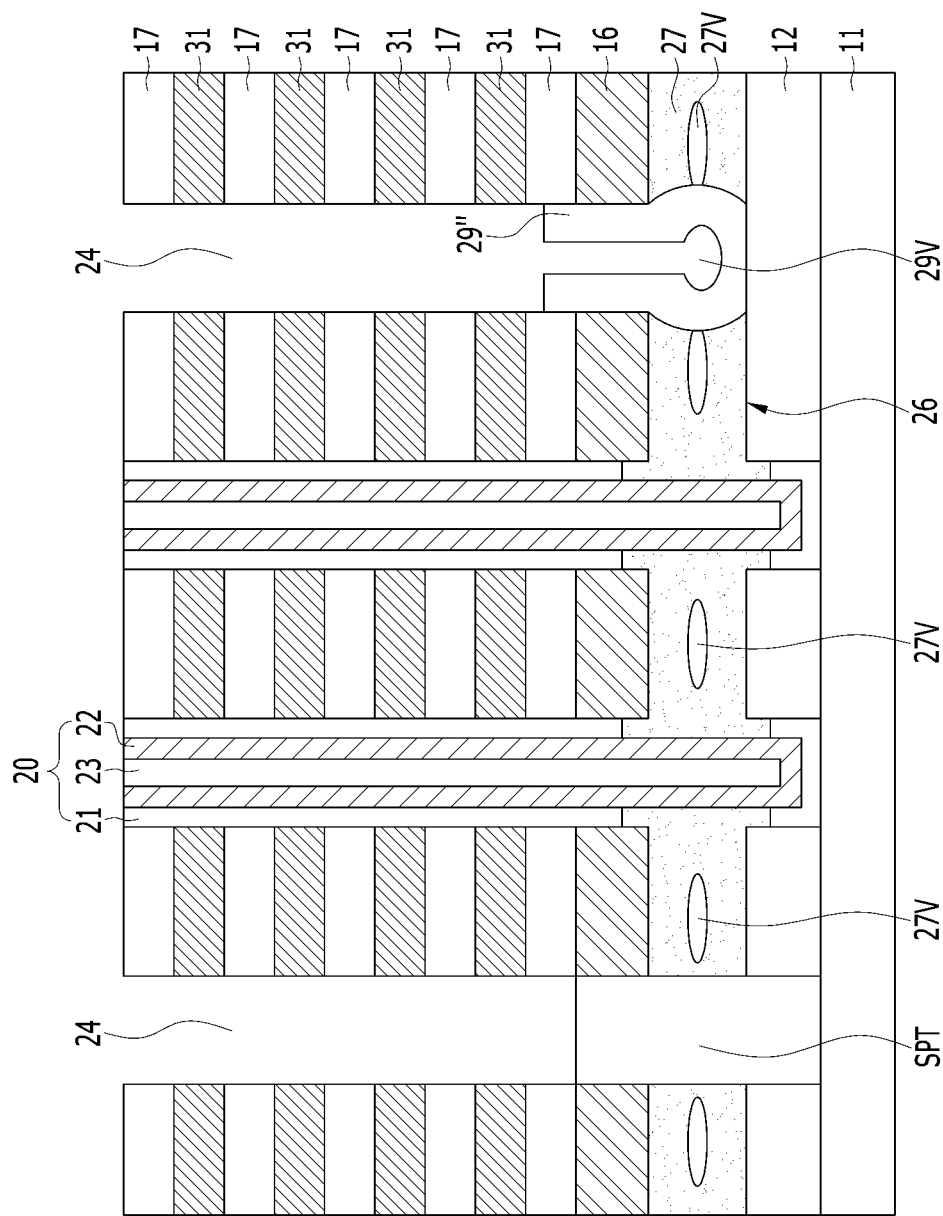

FIGS. 18 to 20 are cross-sectional views illustrating a method for fabricating a vertical semiconductor device in accordance with another embodiment of the present invention. In FIGS. 18 to 20, the same reference numerals also appearing in FIGS. 3 to 17 may designate similar components. Hereinafter, detailed descriptions on the components also appearing in FIGS. 3 to 17 may be omitted.

First, a first contact layer 27 partially filling the lateral recess 26 may be formed by a series of the processes shown in FIGS. 3 to 9. The first contact layer 27 may include a first void 27V and an exposed surface 27R.

Referring to FIG. 18, a chemical barrier layer 29" may be formed on the exposed surfaces 27R of the first contact layer 27. The chemical barrier layer 29" may have an etch selectivity with respect to the dielectric layers 17 and the sacrificial layers 18. The chemical barrier layer 29" may include an oxide. For example, the chemical barrier layer 29" may include ASD-type silicon oxide, and the ASD-type silicon oxide may be selectively deposited on the surface of the first contact layer 28.

The chemical barrier layer 29" may be conformally formed on the exposed surface 27R of the first contact layer 27. As a result, the first void 27V of the first contact layer 27 may not be filled with the chemical barrier layer 29". After the chemical barrier layer 29" is formed, a third void 29V may be formed in the bottom portion of the slit 24.

According to another embodiment of the present invention, the chemical barrier layer 29" may be formed by selectively oxidizing the exposed surface of the first contact layer 27.

Referring to FIGS. 19 and 20, the sacrificial layers 18 may be replaced with the gate electrodes 31.

First, referring to FIG. 19, the sacrificial layers 18 may be selectively removed. As a result, gate recesses 30 may be formed between the dielectric layers 17. The sacrificial layers 18 may be removed by using phosphoric acid ($H_3PO_4$). While the sacrificial layers 18 are removed by using phosphoric acid, the chemical barrier layer 29" may not be removed due to its etch selectivity.

The first contact layer 27 may be protected by the chemical barrier layer 29" while the sacrificial layers 18 are removed. Accordingly, the chemical barrier layer 29" may protect the first void 27V from being exposed.

As described above, according to the embodiment of the present invention, since the chemical barrier layer 29" is formed on the first contact layer 27, penetration of phosphoric acid may be prevented. The first contact layer 27 may include a void 27V, and the chemical barrier layer 29" may conformally cover the exposed surface of the first contact layer 27 to block the void 27V.

Referring to FIG. 20, gate electrodes 31 may be formed in the gate recesses 30. The gate electrodes 31 may include titanium nitride, tungsten, or a combination thereof.

According to the embodiments of the present invention, exposure of voids which is caused when the first contact layer 27 and the second contact layer 28 are formed may be prevented, and the expansion of voids caused by bending in a subsequent process may be controlled.

Also, according to the embodiments of the present invention, penetration of a chemical may be blocked in a subsequent process, thereby preventing disconnection between the channel layer 22 and the bit line (not shown).

While the present invention has been described with respect to the specific embodiments, it will be apparent to those skilled in the art that various changes and modifications may be made without departing from the spirit and scope of the invention as defined in the following claims.

What is claimed is:

1. A method for fabricating a vertical semiconductor device, comprising:
    forming a lower-level stack including a source sacrificial layer over a semiconductor substrate;
    forming an upper-level stack including dielectric layers and sacrificial layers over the lower-level stack;

forming a vertical channel structure including a channel layer and a memory layer that penetrates the upper-level stack and the lower-level stack;

forming a slit that penetrates the upper-level stack while exposing the source sacrificial layer;

forming a lateral recess that extends from the slit by removing the source sacrificial layer, wherein the forming the lateral recess forms vertically-extending undercuts in the memory layer, at least one of the vertically-extending undercuts extending into the source sacrificial layer over the semiconductor substrate;

forming a first contact layer which is coupled to a portion of the channel layer while filling the lateral recess and while filling the vertically-extending undercuts;

selectively forming a second contact layer over an exposed surface of the first contact layer; and selectively forming a chemical barrier layer over the second contact layer.

2. The method of claim 1, wherein the selectively forming of the second contact layer includes:

selectively growing a polysilicon layer from the exposed surface of the first contact layer.

3. The method of claim 2, wherein the polysilicon layer includes voids while filling a bottom portion of the slit.

4. The method of claim 1, wherein the forming of the first contact layer includes:

depositing a polysilicon layer to fill the lateral recess; and forming an exposed surface for growing the second contact layer over the deposited polysilicon layer, and wherein the deposited polysilicon layer includes a plurality of voids.

5. The method of claim 1, wherein the selectively forming of the chemical barrier layer over the second contact layer includes:

selectively depositing silicon oxide over a surface of the second contact layer.

6. The method of claim 5, wherein the second contact layer includes a polysilicon layer, and the chemical barrier layer includes a silicon oxide.

7. The method of claim 1, further comprising:

replacing the sacrificial layers of an upper-level stack with gate electrodes, after the selectively forming of the chemical barrier layer over the second contact layer.

8. The method of claim 1, wherein the second contact layer conformally covers the exposed surface of the first contact layer.

9. The method of claim 8, wherein the selectively forming of the chemical barrier layer over the second contact layer includes:

forming silicon oxide by selectively oxidizing the surface of the second contact layer.

10. The method of claim 1, further comprising:

forming supporters penetrating the lower-level stack after forming the lower-level stack.

* * * * *